(12) United States Patent
Braun et al.

(10) Patent No.: US 10,073,293 B2
(45) Date of Patent: Sep. 11, 2018

(54) OPTICAL MICROCAVITY FOR A HIGH-CONTRAST DISPLAY

(71) Applicant: The Board of Trustees of the University of Illinois, Urbana, IL (US)

(72) Inventors: Paul V. Braun, Champaign, IL (US); Osman S. Cifci, Urbana, IL (US); Eric S. Epstein, Urbana, IL (US); Hao Chen, Urbana, IL (US); Lu Xu, Champaign, IL (US); Ralph G. Nuzzo, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 11 days.

(21) Appl. No.: 15/484,656

(22) Filed: Apr. 11, 2017

(65) Prior Publication Data
US 2017/0293169 A1    Oct. 12, 2017

Related U.S. Application Data

(60) Provisional application No. 62/321,263, filed on Apr. 12, 2016.

(51) Int. Cl.
*G02F 1/13357* (2006.01)
*G02F 1/1335* (2006.01)
(Continued)

(52) U.S. Cl.
CPC ........ *G02F 1/1336* (2013.01); *G02F 1/13338* (2013.01); *G02F 1/133509* (2013.01); *G02F 1/133528* (2013.01); *H01L 51/5281* (2013.01); *G02B 6/0046* (2013.01); *G02B 6/0051* (2013.01); *G02B 6/0053* (2013.01);
(Continued)

(58) Field of Classification Search
None
See application file for complete search history.

(56) References Cited

U.S. PATENT DOCUMENTS 7,282,798 B2 * 10/2007 Venkatasubramanian ..................
  F25B 21/02
  257/13
9,405,146 B2    8/2016 Zhang
(Continued)

FOREIGN PATENT DOCUMENTS

CN    102944943 A    2/2013

OTHER PUBLICATIONS

Bronstein, Noah D. et al., "Quantum Dot Luminescent Concentrator Cavity Exhibiting 30-fold Concentration," *ACS Photonics*, 2 (2015), pp. 1576-1583.
(Continued)

*Primary Examiner* — James Dudek
(74) *Attorney, Agent, or Firm* — Brinks Gilson & Lione

(57) ABSTRACT

An optical microcavity for a high-contrast display comprises an enclosed cavity having a front wall and a back wall, where the front wall comprises a pinhole opening for emission of light from the cavity and the back wall is configured to generate or transmit light into the cavity. An outer surface of the front wall absorbs some or substantially all optical wavelengths of externally incident light so as to appear black or colored. An inner surface of the front wall comprises a light reflectivity of greater than 90% to promote photon recycling within the cavity and light emission through the pinhole opening.

21 Claims, 4 Drawing Sheets

(51) Int. Cl.
     *G02F 1/1333*     (2006.01)
     *H01L 51/52*     (2006.01)
     *F21V 8/00*     (2006.01)

(52) U.S. Cl.
     CPC .............. *G02B 6/0055* (2013.01); *G02F 2001/133614* (2013.01); *G02F 2203/34* (2013.01)

(56) References Cited

U.S. PATENT DOCUMENTS

2011/0089809 A1     4/2011   Noh
2016/0285008 A1*   9/2016   Okubo ............... C07D 401/14

OTHER PUBLICATIONS

Debije, Michael G. et al., "Thirty Years of Luminescent Solar Concentrator Research: Solar Energy for the Built Environment," *Advanced Energy Materials*, 2 (2012) pp. 12-35.

Goetzberger, A. et al., "Solar Energy Conversion with Fluorescent Collectors," *Applied Physics*, 14 (1977) 123-139.

* cited by examiner

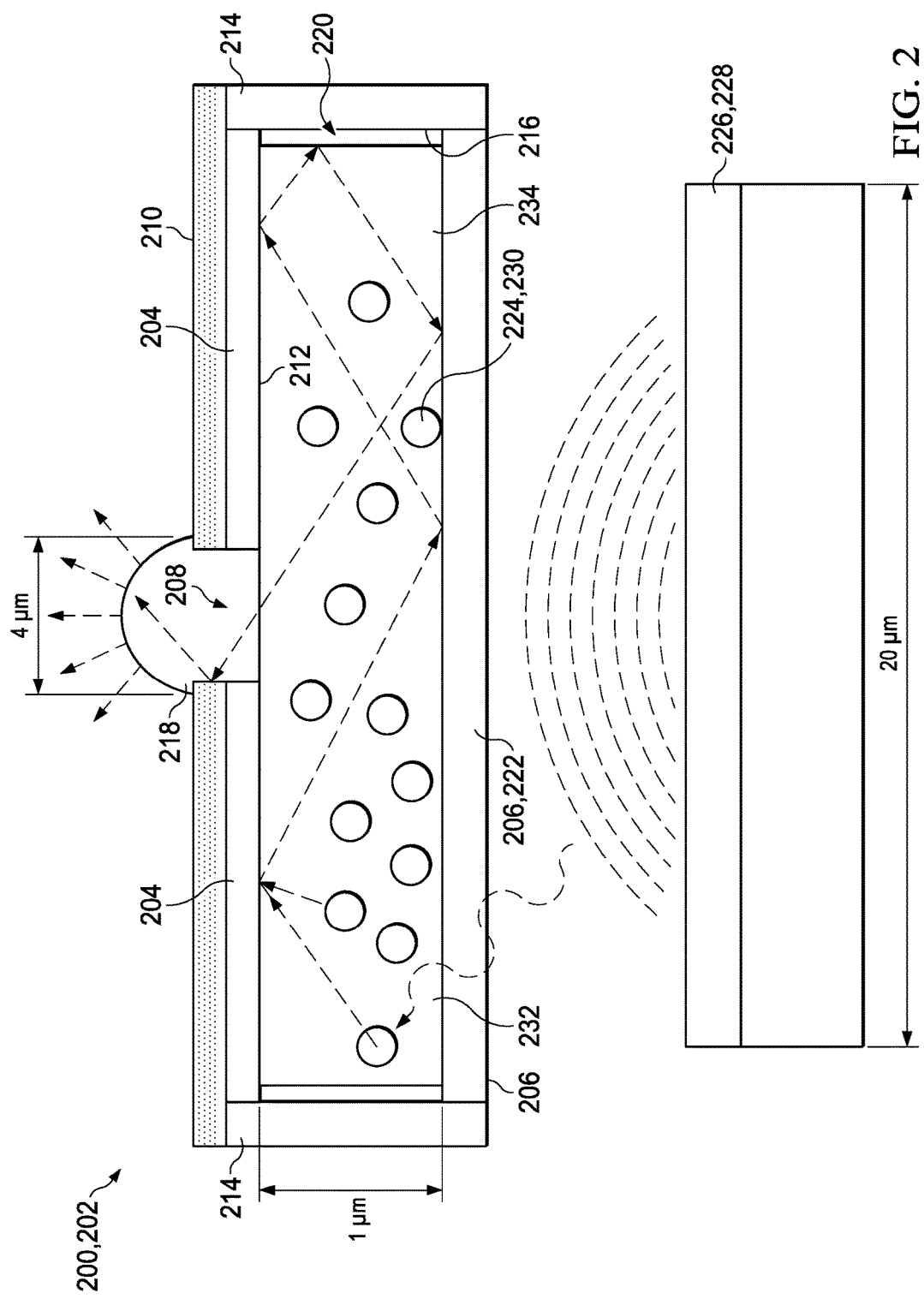

OPTICAL MICROCAVITY FOR A HIGH-CONTRAST DISPLAY

RELATED APPLICATION

The present patent document claims the benefit of priority under 35 U.S.C. § 119(e) to U.S. Provisional Patent Application Ser. No. 62/321,263, filed on Apr. 12, 2016, which is hereby incorporated by reference in its entirety.

TECHNICAL FIELD

The present disclosure relates generally to optical display technology, and more specifically to a microcavity device to improve display contrast.

BACKGROUND

LED-backlit liquid crystal display (LCD) devices currently dominate the color display market, in part because they are relatively inexpensive and reliable to produce. The schematic of FIG. 1A illustrates a conventional LED-backlit LCD, which produces color by filtering white light through color filters placed adjacent to the liquid crystal (LC) layer. Each sub-pixel of the display contains a color filter to output either red, green or blue light. Since the color filter eliminates two out of three colors of the RGB (red-green-blue) spectrum, there may be substantial losses in optical intensity, which leads to higher power requirements. As evidenced by the transmission profile of a CF-60 type color filter shown in FIG. 1B, devices utilizing white backlights with even the purest red, blue and green components exhibit a loss of over two-thirds of the photons that transmit through the LCD device in each color filter. Thus, color filters can impose significant limitations on the accessible color gamut and output efficiency of advanced displays.

LCD devices may suffer from a low ambient contrast ratio because of reflection of external light from the front surface. One approach currently used in LCDs to reduce surface reflections back to the viewer's eye is to introduce a circular polarizer at the top of the LCD device. The ambient light goes through the circular polarizer and becomes circularly polarized light. Upon reflection from a surface, its polarization state becomes opposite of the original beam and the beam is blocked by the circular polarizer on the way back. One problem with this approach is that the light produced by the LCD also passes through the circular polarizer, which leads to significant absorption of the light.

The various optical losses in LCD displays may reduce the overall light usage to only 6-7% for conventional displays, and as low as 4% for touch panel displays.

The advent of organic light emitting display (OLED) devices has introduced attractive features to optical displays, such as wide, vibrant color gamuts and mechanical flexibility. However, OLED devices may suffer from a low ambient contrast ratio because of reflection of external light from the front surface. One approach currently used in OLEDs to reduce surface reflections back to the viewer's eye is to introduce a circular polarizer at the top of the OLED device. The ambient light goes through the circular polarizer and becomes circularly polarized light. Upon reflection from a surface, its polarization state becomes opposite of the original beam and the beam is blocked by the circular polarizer on the way back. One problem with this approach is that the light produced in the emissive layer of the OLED also passes through the circular polarizer, which can lead to absorption of more than 50% of the photons generated by the OLED.

Accordingly, new innovations are sought to improve the efficiency, contrast, color gamut, and power consumption of advanced displays.

BRIEF SUMMARY

An optical microcavity for a high-contrast display comprises an enclosed cavity having a front wall and a back wall, where the front wall comprises a pinhole opening for emission of light from the cavity and the back wall is configured to generate or transmit light into the cavity. An outer surface of the front wall absorbs some or substantially all optical wavelengths of externally incident light so as to appear black or colored. An inner surface of the front wall and any sidewalls that may be present comprises a light reflectivity of greater than 90% to promote photon recycling within the cavity and light emission through the pinhole opening.

A subpixel of a liquid crystal display (LCD) may include the optical microcavity as described herein according to any embodiment, where the back wall comprises a band pass filter for transmitting light of a predetermined wavelength range into the cavity. The subpixel may further include a front polarizer adjacent to an outer surface of the back wall, a liquid crystal material disposed between the front polarizer and a back polarizer, and a light emitter behind the back polarizer for generating light of the predetermined wavelength range.

A subpixel of an organic light emitting diode (OLED) may include the optical microcavity as described herein according to any embodiment, where the back wall comprises an organic emissive layer for generating light of a predetermined wavelength range in the cavity.

BRIEF DESCRIPTION OF THE DRAWINGS

FIG. 2 is a cross-sectional schematic of an optical microcavity and narrow-band light source behind the microcavity; an intervening liquid crystal layer is shown in FIG. 3.

DETAILED DESCRIPTION

Figure 1A:
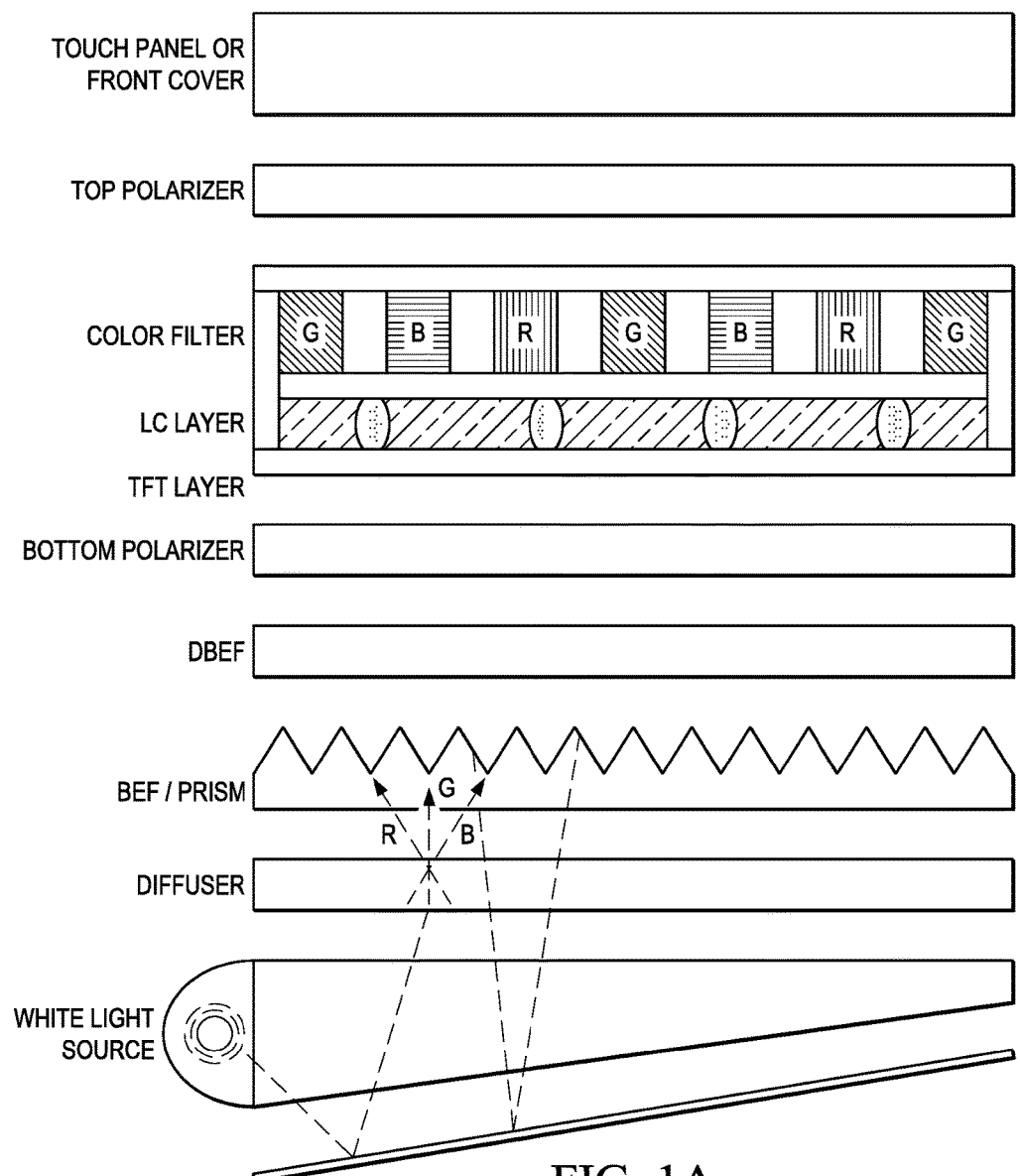
FIG. 1A is a cross-sectional schematic of a conventional LED-backlit LCD panel.
Figure 1B:
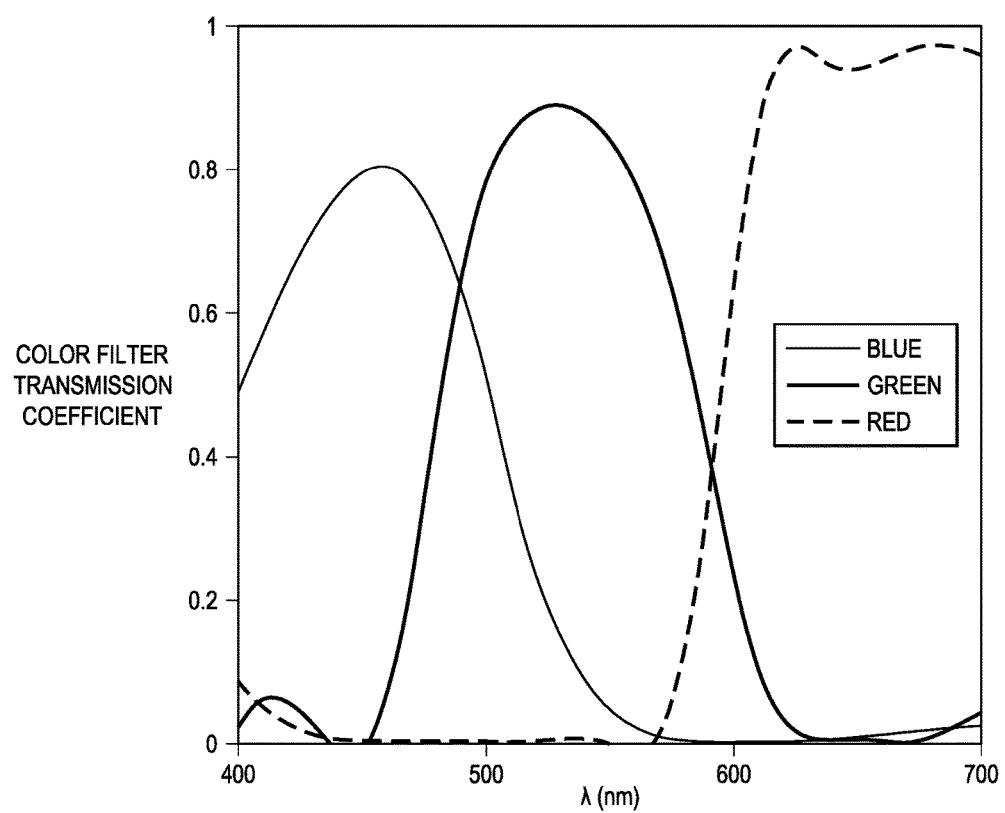
FIG. 1B shows a transmission profile of a commercial (CF-60 type) color filter used in conventional LED-backlit LCD displays.

The present disclosure provides a new design architecture for advanced displays that utilizes an optical microcavity to produce color output. The new design may reduce or eliminate the need for color filters and polarization filters, the former of which tends to be a major detriment to obtaining high optical efficiencies in conventional backlit LCDs, and the latter of which is often required to enhance ambient contrast in both LCDs and OLEDs. Incorporation of the optical microcavity into backlit LCD and OLED devices may lead to a reduction in the required power as well as improved display performance.

Referring now to FIG. 2, an optical microcavity 200 for a high-contrast display includes an enclosed cavity 202 comprising a front wall 204 and a back wall 206, where the front wall 204 includes a pinhole opening 208 for emission of light from the cavity 202, and the back wall 206 is configured to generate or transmit light into the cavity 202. The back wall 206 may also be effective at minimizing or preventing light leakage from the cavity 202. An outer surface 210 of the front wall 204 absorbs some or substantially all optical wavelengths of externally incident light and thus appears black or colored. An inner surface 212 of the front wall 204 comprises a light reflectivity of greater than 90% to promote photon recycling within the cavity 202 and light emission through the pinhole opening 208. In some cases, the light reflectivity may be greater than about 95%, or greater than about 98%, where light reflectivity is determined by dividing incident optical light intensity by reflected optical light intensity and multiplying by 100.

The pinhole opening 208 is small in size relative to the front wall 204 of the cavity 202. As would be recognized by one of ordinary skill in the art, the term "pinhole" is used as a descriptor to convey the small size of the opening relative to the front wall of the cavity without limiting the opening to a particular size or fabrication method. Typically, the pinhole opening 208 has an areal size no greater than about 15% of a surface area of the front wall 204, and the areal size may be no greater than about 10%, or no greater than about 5%, of the surface area of the front wall 204. For example, the pinhole opening 208 may have a diameter in a range from about 2 microns to about 6 microns, and the front wall 204 of the enclosed cavity 202 may have a surface area in a range from about 400 $\mu m^2$ to about 900 $\mu m^2$. Since the outer surface 210 of the front wall 204 is highly absorptive (e.g., black) and light emission from the cavity 202 is constrained due to the small opening 208, the display can exhibit high ambient contrast. To further control and/or enhance light extraction, a lens 218 may overlie the pinhole opening 208. As illustrated in FIG. 2, the lens 218 may have a convex outer surface.

The optical microcavity 200 of FIG. 2 may include one or more side walls 214 between the front and back walls 204, 206. An interior surface 216 of each of the one or more side walls 214 may exhibit a reflectivity of greater than about 90% (similar to the inner surface 212 of the front wall 204) to promote light extraction through the pinhole opening 208. The reflectivity may also be greater than about 95%, or greater than about 98%.

The high reflectivity of the inner surface 212 of the front wall 204 and the interior surface(s) 216 of any side walls 214 may be achieved using a reflective metal coating, which may be referred to as a mirror coating, or as a mirror. Suitable reflective metal coatings may comprise silver, gold, platinum, nickel, aluminum, titanium, and/or another metal. Also or alternatively, the high reflectivity of the inner surface 212 of the front wall 204 and the interior surface(s) 216 of any side walls 214 may be achieved using a distributed Bragg reflector or a diffuse reflector, such as Spectralon, barium sulfate, or another diffuse reflector material. The enclosed cavity 202 may further include an air gap 220 adjacent to at least one of the inner surfaces 212, 216. Along with the highly reflective inner surfaces 212, 216, the air gap(s) 220 may help to promote photon recycling within the microcavity 200.

The highly absorptive outer surface 210 of the front wall 204, which is designed to produce high contrast with the light escaping from the pinhole opening 208, may comprise carbon or another black or colored pigment applied to the front wall as part of a paint or coating formulation, or may be made of a material that absorbs strongly some or all optical wavelengths. As indicated above, the outer surface 210 may absorb substantially all optical wavelengths of externally incident light, thus appearing black. "Substantially all" optical wavelengths may be understood to refer to at least about 90% or at least about 95% of the optical wavelengths impinging upon the outer surface 210. In an example where the outer surface appears colored, the outer surface may absorb substantially all optical wavelengths except for a predetermined range of optical wavelengths corresponding to a particular color or colors, such as from about 440 nm to 500 nm for a blue surface, from about 510 nm to about 570 nm for a green surface, or from about 600 nm to about 660 nm for a red surface. Other suitable predetermined ranges of optical wavelengths may be determined by the skilled artisan based on the desired color(s) of the outer surface 210.

The enclosed cavity 202 may include only one side wall or may include multiple side walls 214, depending on the microcavity geometry. For example, as shown in FIG. 2, the enclosed cavity 202 may take the shape of a parallelepiped including front and back walls 204, 206 and four side walls 214. Alternatively, the enclosed cavity may take the shape of a cylinder including front and back walls and only a single (curved) side wall. Any or all of the front, back and side walls may be planar (flat) or curved. It is also contemplated that side walls may not be present. For example, if one or both of the front wall 204 and the back wall 206 are curved, then the cavity 202 may be enclosed without side walls. For example, the cavity 202 may take the shape of a hemisphere, where either the front or back wall has a convex curvature and no side walls are present. Other cavity geometries are also possible, based upon any advantageous combination of planar and/or curved walls having a high interior reflectivity for boosting light emission through the pinhole opening 208.

As indicated above, the back wall 206 of the microcavity may be configured to generate or transmit light into the cavity.

In one example, the back wall 206 may comprise a band pass filter 222 configured to transmit light of a predetermined wavelength or wavelength range into the cavity 202. The transmitted light may then be down-converted by a phosphor 224 in the cavity 202 to light of a desired wavelength range (color), which may be extracted through the pinhole opening 208. As would be recognized by one of ordinary skill in the art, the term "down conversion" refers to conversion of light of a predetermined wavelength or wavelength range (e.g., blue or ultraviolet light) to light of a longer wavelength or wavelength range (e.g., green or red light). Due to the presence of the band pass filter 222, which selectively transmits light of a given wavelength range and blocks light outside this wavelength range, the down-converted light emitted by the phosphor 224 may be completely or substantially prevented from escaping through the back wall 206 of the cavity 202. The band pass filter 222 may also be referred to as a notch filter or a distributed Bragg reflector (DBR). To generate the light that is transmitted through the band pass filter 222 to excite the phosphor 224, a light emitter 226 capable of narrow-band light emission in a suitable wavelength range (e.g., a UV or blue light emitting diode (LED) 228) may be positioned outside the cavity 202 facing the filter 222. The notch filter 222 acts as a UV or deep-blue pass filter while strongly reflecting the emitted light from the phosphor 224, thereby concentrating light towards the pinhole opening 208 and highly reflective walls while minimizing or preventing leakage of light into adjacent sub-pixels. In the event that some light leakage occurs through the notch filter 222, an additional filter configured to absorb light generated by the phosphor 224 (e.g., a green- or red-absorbing filter) may be added adjacent to the notch filter 222 to minimize cross-talk between adjacent sub-pixels. Similarly, an additional filter may be employed adjacent to the front wall 204 to prevent light leakage from the cavity 202, except through the opening 218. The optical microcavity 202 and narrow-band light emitter 226 of this example may take the place of the color filters and white light emitters utilized in conventional LED-backlit LCD devices.

Figure 3:
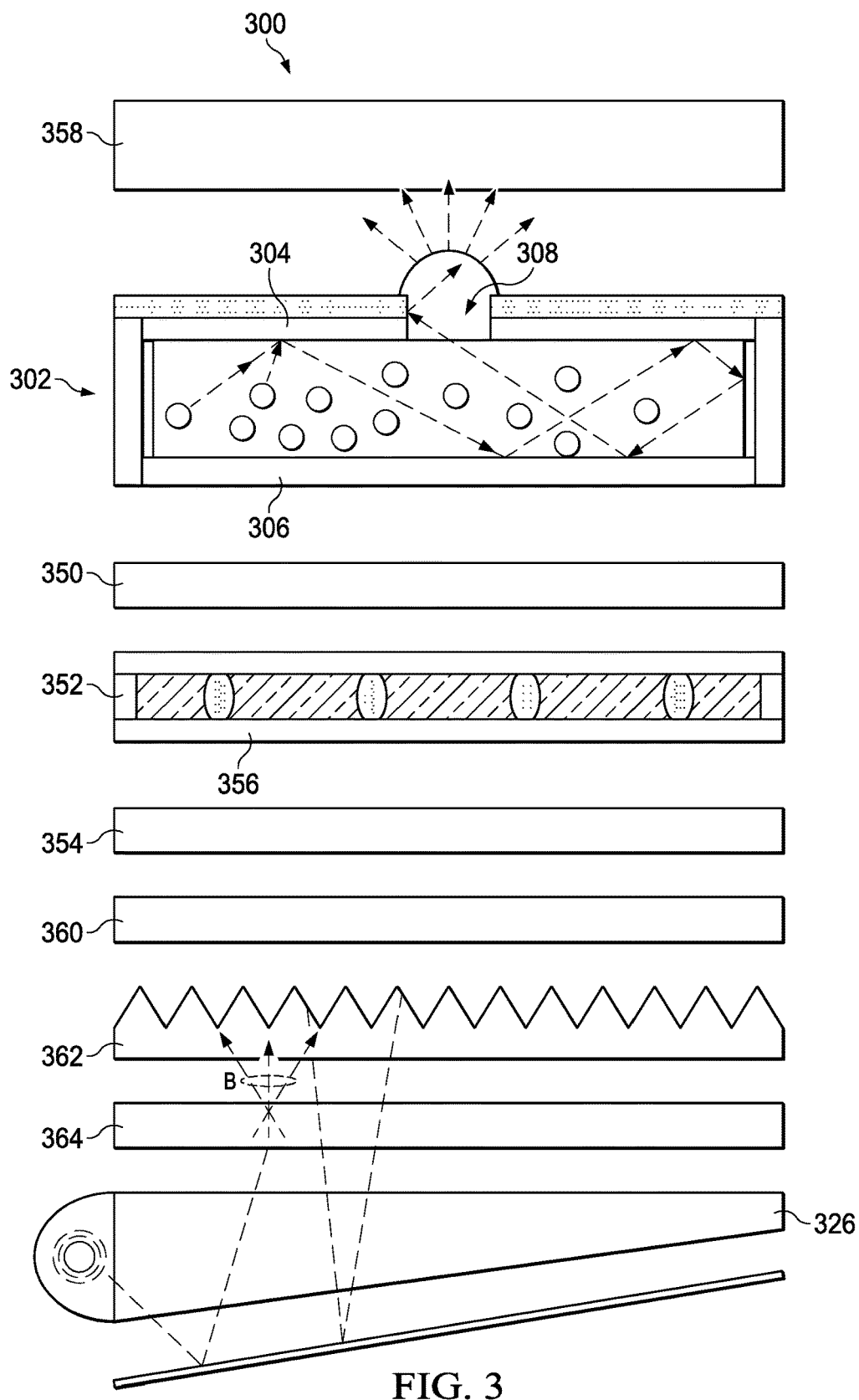
FIG. 3 is a cross-sectional schematic of a LED-backlit LCD panel including an optical microcavity.

FIG. 3 shows a subpixel 300 of an exemplary LED-backlit LCD that includes an optical microcavity 302 comprising a front wall 304 and a back wall 306, where the front wall includes a pinhole opening 308 for emission of light from the cavity and the back wall comprises a bandpass filter to transmit light of a predetermined wavelength range into the cavity, as described above. An outer surface of the front wall absorbs some or substantially all wavelengths of externally incident light, such that the outer surface appears black or colored, and an inner surface of the front wall comprises a light reflectivity of greater than about 90% to promote photon recycling within the cavity and light emission through the pinhole opening, also as described above. A front (or top) polarizer 350 is adjacent to an outer surface of the back wall of the cavity 302, and a liquid crystal material 352 is positioned between the front polarizer 350 and a back (or bottom) polarizer 354. A light emitter 326 behind the back polarizer 354 directs light of the predetermined wavelength range through the liquid crystal material 352 and into the cavity 302. A thin film transistor (TFT) layer 356 may lie between the liquid crystal material 352 and the bottom polarizer 354. Additional optical devices known in the art, such as a dual brightness enhancement film (DBEF) 360, BEF/prism 362 and diffuser 364 may lie between the bottom polarizer 354 and the light emitter 326. A touch panel or front cover 358 may overlie the optical microcavity 302 at the front of the device.

In another example, the back wall 206 may comprise an organic emissive layer for generating light of a predetermined wavelength range (or desired color) in the cavity 202, such that the subpixel is part of an OLED. The idea of cycling photons inside a micro-cavity 202 and allowing the extraction of photons from only a small opening 208 in the front wall 204, as described above, can potentially benefit OLED displays, in addition to LCDs. The OLED does not employ a backlight; rather, it relies on electrically driven photon emission from the organic emissive layer, which may comprise an organic semiconductor. By utilizing a top-emitting organic emissive layer and surrounding it with highly reflective front and side wall surfaces, leaving only a small opening through the front wall, an OLED comprising an optical cavity may be formed. For the device to function efficiently, reabsorption of emitted photons inside the cavity is preferably minimized. Thus, the organic emissive layer may have a large Stokes shift. A suitable organic semiconductor may comprise 4-(dicyanomethylene)-2-tert-butyl-6-(1,1,7,7-tetramethyljulolidin-4-yl-vinyl)-4H-pyran (DCJTB). A phosphor may or may not be included within the cavity 202; light of a desired color may be emitted directly from the organic emissive layer, and since a bandpass filter is not needed for light transmission into the cavity 202, down-conversion is not required to prevent escape of the light. In addition, the need for circular polarizers, which are typically required for OLED displays, may be eliminated.

The phosphor 224 mentioned above may take the form of luminescent particles 230, such as inorganic quantum dots or organic lumophores. Suitable quantum dots may comprise semiconductor nanoparticles or core-shell nanoparticles comprising CdS, CdSe, ZnS, ZnSe, PbSe, and/or another compound, such as any of the compounds described in U.S. Pat. No. 7,588,828, which is hereby incorporated by reference in its entirety. Semiconductor quantum dots are stable, narrow-band light emitters whose light emission may be tuned by changing the size of the nanoparticles. For example, it has been shown that, when irradiated by ultraviolet light, larger quantum dots (e.g., 10-12 nm in diameter) may have longer wavelength (orange or red) emission, while smaller quantum dots (e.g., 4-6 nm in diameter) may have shorter wavelength (blue or green) emission. With proper selection of the size and composition of the quantum dot, a down-converting phosphor capable of emitting red, green, or blue light (upon irradiation with ultraviolet or blue light) may be obtained. Organic lumophores (e.g., fluorescent dyes) may also exhibit the desired down conversion, although thermal stability may be sacrificed. The luminescent particles 230 may be embedded in an optically transparent polymer 232, thereby forming a luminescent polymer composite 234 that may partially or completely fill the cavity. The optically transparent polymer 232 of the composite 234 may comprise an acrylate polymer (e.g., poly (methyl methacrylate) and/or poly(lauryl methacrylate)), a polycarbonate, and/or an epoxy, for example. The luminescent polymer composite 234 may take the form of a thin film and/or have a shape determined by the geometry of the cavity. The air gap 220 mentioned above may lie between the interior surface 216 of the side wall 214 and the luminescent polymer composite 234. An air gap may also or alternatively be present between the luminescent polymer composite 234 and the inner surface of the front and/or back walls 204, 206.

Ray tracing simulations are employed to determine the most important parameters for obtaining high output efficiencies from the optical microcavity as well as the relationship between output efficiency and ambient contrast. The optimal thickness for the luminescent polymer composite, the ideal loading of luminescent particles in the composite, and the impact of the reflectivities of the mirrors and bandpass filter(s) on the output efficiency may be calculated. The simulations use literature values and/or experimental data for the properties of metallic mirrors and optical filters. Via established modeling methods (e.g., transfer matrix or finite difference time domain (FDTD) simulations) it is possible to design and fabricate optical filters with high omnidirectional reflectivities at the emission wavelength (or wavelength range) of the quantum dot emitters.

Ray tracing simulations carried out based on the model device of FIG. 2, where an absorption of 90% and quantum efficiency of 95% are assumed for the luminescent polymer composite, reveals that the optical microcavity may exhibit an output efficiency of 44.9%, significantly greater than any color filter used in conventional optical displays. To simplify the simulations, the reflectivity values of the band pass filters (e.g., DBR and UV pass filter) are assumed to be an average over all incident angles. Since the light in each subpixel can be produced by narrow linewidth quantum dots rather than a wide-band white light source, the design has the potential to achieve color gamuts on par with emerging OLED displays. It is believed that the reflectivity values (98% averaged over all incident angles for the top DBR, 96% for the side silver mirrors, and 95% for the deep-blue-pass DBR filter) are attainable using current technologies.

In addition to the previously discussed light-tracing simulations, Monte Carlo simulations of photon transport inside the cavity are performed. The Monte Carlo simulation method introduces a large number of photons with a random distribution of propagation directions and wavelengths into the sample. The photons then propagate inside the sample according to the optical constraints defined by the sample.

These constraints, in the present case, include the refractive index of the sample, the reflectivity values of the front and side walls, absorption and emission characteristics of the quantum dots, as well as presence of scattering sites. By accumulating the fate of each photon, the extraction efficiency of the optical cavity may be determined. An important advantage of the Monte Carlo method is that it has the ability to capture multi-physics phenomena such as wavelength-dependent absorption, reflection and scattering. This approach may be employed to simulate the expected photon extraction efficiency for various opening areas, quantum yields and reflectivity values.

The optical efficiency is determined experimentally by optical microspectroscopy. The back wall is pumped by a blue light source (e.g., a blue LED), and the output from the front wall is collected using an optical micro-spectrometer that preferably can measure the emission over all angles, including from the back wall of the device. Experiments are carried out using quantum dots as the luminescent particles inside the optical cavity. The quantum dots are excited by a deep blue source and they emit in orange colors. A reflective silver coating is employed as a mirror on the inner surfaces of the front and side walls, while the quantum dot composite is positioned on an almost ideal DBR (the back wall). The dimensions of the experimental device are centimeter-scale, but the optical cavity may be scaled down to the microscale regime. The experiments yield a photon extraction efficiency of 34% for an opening of 11% of the front wall surface area. The result matches very well with the Monte Carlo simulations. As a comparison, 34% efficiency is superior to a conventional filter array, which has an efficiency of around 25%. It may be possible to increase the opening ratio to achieve higher photon extraction efficiency; however this may come at the expense of reduced ambient contrast. Using higher efficiency luminescent particles may also increase the efficiency. It is preferred that the optical cavity exhibits a photon extraction (or output) efficiency of at least about 30%, at least about 35%, or at least about 40%.

A subpixel of a display may include a single optical microcavity or an array of optical microcavities ("microcavity arrays") configured to produce red, green or blue light, and a pixel of a display may include an array of red, green and blue light-emitting subpixels. Microcavity arrays may be fabricated using microfabrication techniques including, but not limited to, standard photolithography techniques, stereolithography, soft-lithography and/or transfer printing, in combination with established practices for thin film deposition and etching. The microcavity arrays may include as few as two or three or as many as hundreds or thousands of optical microcavities. Each component of a microcavity may be fabricated using techniques known in the art for that specific component. The luminescent polymer composite may be prepared using methods known in the art from suitable lumophores and optically transparent polymers, as set forth above, including 3D printing, spin-coating, spray-coating or molding. The inner reflective surfaces (front and side walls) may be fabricated by vapor deposition of metals or multilayered thin films (e.g. distributed Bragg reflectors), or by 3D printing, spin-coating, spray coating, or fabrication-through-etching (chemical or physical) of diffuse optical reflectors. The absorptive outer surface of the front wall can be obtained by any deposition technique, including spin coating or spray coating. The back wall bandpass filter(s) may be obtained from commercial sources or produced via spin-coating or vapor deposition methods.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

Although considerable detail with reference to certain embodiments has been described, other embodiments are possible. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages, and it is not necessarily expected that all of the described advantages will be achieved with every embodiment.

The invention claimed is:

1. An optical microcavity for a high-contrast display, the optical microcavity comprising:
    an enclosed cavity comprising a front wall and a back wall, the front wall comprising a pinhole opening for emission of light from the cavity and the back wall being configured to generate or transmit light into the cavity,
    wherein an outer surface of the front wall absorbs some or substantially all optical wavelengths of externally incident light, the outer surface appearing black or colored,
    wherein an inner surface of the front wall comprises a light reflectivity of greater than 90% to promote photon recycling within the cavity and light emission through the pinhole opening.

2. The optical microcavity of claim 1, wherein the pinhole opening has an areal size no greater than about 15% of a surface area of the front wall.

3. The optical microcavity of claim 1, wherein one or both of the front wall and the back wall are curved, the enclosed cavity including no side walls.

4. The optical microcavity of claim 1, further comprising a lens overlying the pinhole opening, the lens having a convex outer surface.

5. The optical microcavity of claim 1, wherein the back wall comprises an organic emissive layer for generating light in the cavity.

6. The optical microcavity of claim 1, wherein the back wall comprises a band pass filter configured to transmit light of a predetermined wavelength range into the cavity.

7. The optical microcavity of claim 6, wherein the predetermined wavelength range comprises blue or ultraviolet wavelengths.

8. The optical microcavity of claim 1, further comprising a polymer composite disposed in the cavity, the polymer composite comprising an optically transparent polymer with luminescent particles embedded therein, the luminescent particles being configured to down-convert light in the cavity.

9. The optical microcavity of claim 8, wherein the optically transparent polymer is selected from the group consisting of: an acrylate polymer, a polycarbonate, and an epoxy.

10. The optical microcavity of claim 8, wherein the luminescent particles are selected from the group consisting of semiconductor quantum dots and organic lumophores.

11. The optical microcavity of claim 1, wherein the inner surface of the front wall comprises a reflective metal coating.

12. The optical microcavity of claim 1, wherein the inner surface of the front wall comprises a distributed Bragg reflector or a diffuse reflector.

13. The optical microcavity of claim 1, further comprising one or more side walls between the front wall and the back wall, an interior surface of each of the one or more side walls comprising a reflectivity of greater than 90%.

14. The optical microcavity of claim 13, wherein each of the interior surfaces comprises a reflective metal coating.

15. The optical microcavity of claim 13, further comprising an air gap adjacent to at least one of the interior surfaces.

16. The optical microcavity of claim 1, further comprising a color absorbing filter of a predetermined optical wavelength range disposed adjacent to the back wall to prevent light leakage.

17. The optical microcavity of claim 1, wherein the enclosed cavity has a shape selected from the group consisting of: parallelepiped, cylinder and hemisphere.

18. The optical microcavity of claim 1 exhibiting a photon extraction efficiency of at least about 30%.

19. The optical microcavity of claim 1, wherein the high-contrast display is selected from a liquid crystal display and an organic light emitting diode.

20. A subpixel of a liquid crystal display (LCD), the subpixel comprising:
the optical microcavity of claim 1, the back wall comprising a band pass filter for transmitting light of a predetermined wavelength range into the cavity;
a front polarizer adjacent to an outer surface of the back wall;
a liquid crystal material disposed between the front polarizer and a back polarizer; and
a light emitter behind the back polarizer for generating the light of the predetermined wavelength range.

21. A subpixel of an organic light emitting diode (OLED), the subpixel comprising:
the optical microcavity of claim 1, the back wall comprising an organic emissive layer for generating light of a predetermined wavelength range in the cavity.

* * * * *